United States Patent
Roeger-Goepfert et al.

(10) Patent No.: US 9,617,647 B2
(45) Date of Patent: *Apr. 11, 2017

(54) COMPOSITION FOR METAL PLATING COMPRISING SUPPRESSING AGENT FOR VOID FREE SUBMICRON FEATURE FILLING

(75) Inventors: Cornelia Roeger-Goepfert, Schwetzingen (DE); Roman Benedikt Raether, Speyer (DE); Dieter Mayer, Darmstadt (DE); Alexandra Haag, Hemhofen (DE); Charlotte Emnet, Stuttgart (DE)

(73) Assignee: BASF SE, Ludwigshafen (DE)

(*) Notice: Subject to any disclaimer, the term of this patent is extended or adjusted under 35 U.S.C. 154(b) by 7 days.

This patent is subject to a terminal disclaimer.

(21) Appl. No.: 13/384,732

(22) PCT Filed: Jul. 19, 2010

(86) PCT No.: PCT/EP2010/060375
§ 371 (c)(1),
(2), (4) Date: Jan. 18, 2012

(87) PCT Pub. No.: WO2011/012475
PCT Pub. Date: Feb. 3, 2011

(65) Prior Publication Data
US 2012/0118750 A1    May 17, 2012

Related U.S. Application Data

(60) Provisional application No. 61/229,809, filed on Jul. 30, 2009.

(51) Int. Cl.
C25D 5/02 (2006.01)
H01L 21/288 (2006.01)
(Continued)

(52) U.S. Cl.
CPC ............... C25D 3/38 (2013.01); C25D 3/02 (2013.01); H01L 21/2885 (2013.01); H01L 21/76877 (2013.01); C25D 3/40 (2013.01)

(58) Field of Classification Search
CPC .... C25D 3/38; C25D 3/58; C25D 5/02; H01L 2224/03462
(Continued)

(56) References Cited

U.S. PATENT DOCUMENTS 4,430,490 A * 2/1984 Doerge ............. C08G 65/2606
521/175
6,776,893 B1  8/2004 Too et al. ..................... 205/123
(Continued)

FOREIGN PATENT DOCUMENTS

GB    602 591        5/1948
GB    602591 A *     5/1948 ............... C25D 3/02
(Continued)

OTHER PUBLICATIONS

U.S. Appl. No. 13/535,847, filed Jun. 28, 2012, Roeger-Goepfert, et al.
(Continued)

Primary Examiner — Edna Wong
(74) Attorney, Agent, or Firm — Oblon, McClelland, Maier & Neustadt, L.L.P.

(57) ABSTRACT

A composition comprising at least one source of metal ions and at least one additive obtainable by reacting a polyhydric alcohol comprising at least 5 hydroxyl functional groups with at least a first alkylene oxide and a second alkylene oxide from a mixture of the first alkylene oxide and the second alkylene oxide or a third alkylene oxide, a second alkylene oxide, and a first alkylene oxide in aforesaid sequence, the third alkylene oxide having a longer alkyl chain than the second alkylene oxide and the second alky- (Continued)

lene oxide having a longer alkyl chain than the first alkylene oxide.

20 Claims, 7 Drawing Sheets

(51) Int. Cl.
  *C25D 3/58*   (2006.01)
  *C25D 3/38*   (2006.01)
  *C25D 3/02*   (2006.01)
  *H01L 21/768*   (2006.01)
  *C25D 3/40*   (2006.01)

(58) Field of Classification Search
  USPC .................. 205/118, 123, 125, 239, 296
  See application file for complete search history.

(56) References Cited

U.S. PATENT DOCUMENTS

| | | | |
|---|---|---|---|
| 2005/0133376 A1* | 6/2005 | Opaskar | C25D 3/565 205/246 |
| 2005/0199507 A1* | 9/2005 | Shih et al. | 205/291 |
| 2006/0098065 A1* | 5/2006 | Maruyama | C01G 3/02 347/100 |
| 2006/0201820 A1 | 9/2006 | Opaskar et al. | 205/246 |
| 2007/0178697 A1* | 8/2007 | Paneccasio, Jr. | C25D 3/38 438/687 |
| 2012/0128888 A1* | 5/2012 | Roeger-Goepfert et al. | 427/457 |

FOREIGN PATENT DOCUMENTS

WO   WO 02103751 A2 *  12/2002
WO   2006 057873   6/2006

OTHER PUBLICATIONS

International Search Report Issued Oct. 4, 2010 in PCT/EP10/60375 Filed Jul. 19, 2010.

U.S. Appl. No. 13/387,776, filed Jan. 30, 2012, Roeger-Goepfert, et al.

U.S. Appl. No. 61/229,803, filed Jul. 30, 2009, Roeger-Goepfert, et al.

* cited by examiner

Fig. 6a (comparative)
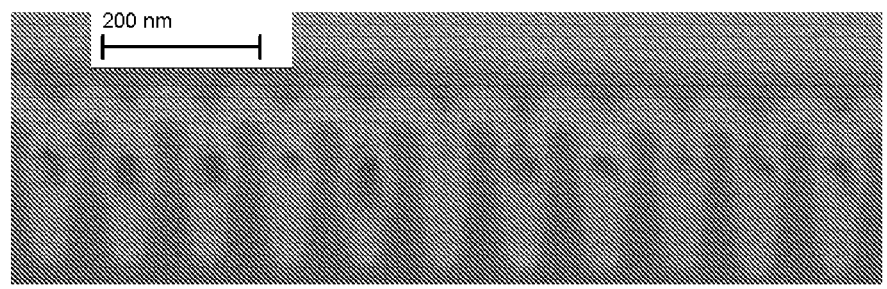
Fig. 6b (comparative)
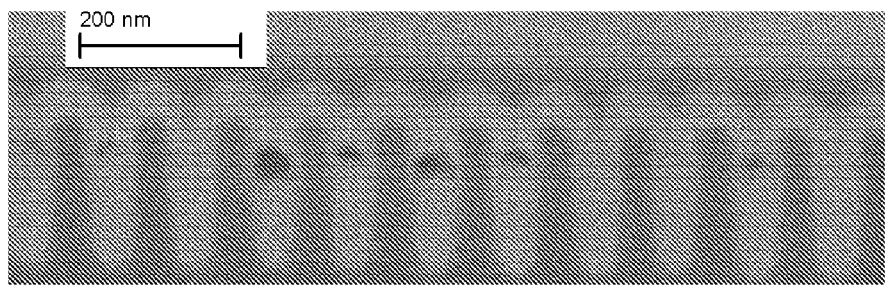

Fig. 7a (comparative)
Fig. 7b (comparative)
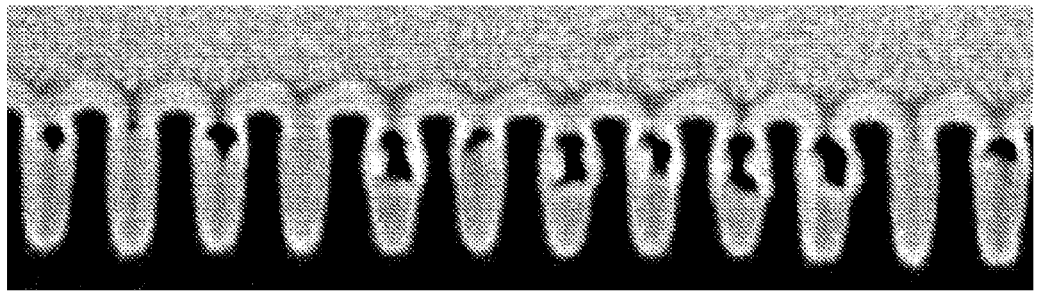

COMPOSITION FOR METAL PLATING COMPRISING SUPPRESSING AGENT FOR VOID FREE SUBMICRON FEATURE FILLING

Filling of small features, such as vias and trenches, by copper electroplating is an essential part of the semiconductor manufacture process. It is well known, that the presence of organic substances as additives in the electroplating bath can be crucial in achieving a uniform metal deposit on a substrate surface and in avoiding defects, such as voids and seams, within the copper lines.

One class of additives are the so-called suppressors or suppressing agents. Suppressors are used to provide a substantially bottom-up filling of small features like vias or trenches. The smaller the features are the more sophisticated the additives have to be to avoid voids and seams. In literature, a variety of different suppressing compounds have been described. The mostly used class of suppressors are polyether compounds like polyglycols or polyalkylene oxides like ethylene oxide propylene oxide copolymers.

Such polyether compounds are manufactured by reacting an alcohol starter comprising one or more hydroxyl groups like glycol or glycerol with polyalkylene oxides.

US 2002/0043468 discloses suppressing agents comprising oxygen or nitrogen containing functional groups located in the branches of a polymer backbone. In general, the branched suppressors have a molecular weight in the range of about 10.000 or greater.

US 2004/0217009 A1 discloses poly(alkylene oxide) random copolymers suppressing agents, which may be linear or star-shaped.

U.S. Pat. No. 6,776,893 B1 discloses suppressing agents selected from block copolymers of polyoxyethylene and polyoxypropylene, a polyoxyethylene or polyoxypropylene derivative of a polyhydric alcohol and a mixed polyoxyethylene and polyoxypropylene derivative of a polyhydric alcohol. Examples of polyhydric alcohols are sorbitol, glycerol and mannitol, preferably glycerol. One class of such suppressing agents contain mixed alkoxy groups such as block copolymers of polyethylene oxide and polypropylene oxide.

With further decreasing aperture size of the features like vias or trenches to dimensions of below 100 nanometers and even below 50 nanometers, respectively, the filling of the interconnects with copper becomes especially challenging, also since the copper seed deposition prior to the copper electrodeposition might exhibit inhomogeneity and non-conformality and thus further decreases the aperture sizes particularly at the top of the apertures. Especially apertures with a seed overhang at the top opening or convex-shaped apertures are challenging to fill and require an especially effective copper growth suppression at the side wall of the feature and the opening of the aperture.

FIG. 3 shows a seeded substrate exhibiting impact of the seed on the opening of the features to be filled. The seed is shown by the light grey layer on the dark grey structures. Since there is an increasing seed overhang issue with further shrinking feature sizes, as depicted in FIG. 3, there is a serious risk of pinch-off void formation in the upper half of the trench close to the opening if the suppressor does not completely avoid sidewall copper growth ("2" in FIGS. 2a to 2c). As can be seen the openings are reduced to less than the half of the width without the seed layer resulting in effective aperture sizes of about 18 nanometer to 16 nanometer, respectively. The seeded feature has a convex shape.

It is therefore an object of the present invention to provide a copper electroplating additive having good superfilling properties, in particular suppressing agents capable of providing a substantially voidless and seamless filling of features on the nanometer and on the micrometer scale with a metal electroplating bath, preferably a copper electroplating bath. It is a further object of the present invention to provide a copper electroplating additive capable of providing a substantially voidless and seamless filling of features having a convex shape.

Surprisingly, it has now been found, that the use of polyoxyalkylated polyalcohol having random copolymer structure and particular triblock copolymers as additives show extraordinary superfilling properties, particularly if used to fill in features having extremely small aperture sizes and/or high aspect ratios. The present invention provides a new class of highly effective, strongly suppressing agents that cope with the seed overhang issue and provide substantially defect free trench filling despite a non-conformal copper seed.

Therefore the present invention provides a composition comprising at least one source of metal ions and at least one polyoxyalkylated polyhydric alcohol having at least 5 hydroxyl groups. The at least one suppressing agent is obtainable by reacting a polyhydric alcohol comprising at least 5 hydroxyl functional groups with at least a first alkylene oxide and a second alkylene oxide from a mixture of the first alkylene oxide and the second alkylene oxide. In this way a polyhydric alcohol is formed comprising random polyoxyalkylene copolymer side chains.

Furthermore, the present invention provides a composition comprising at least one source of metal ions and at least one additive obtainable by reacting a polyhydric alcohol comprising at least 5 hydroxyl functional groups with a third alkylene oxide, a second alkylene oxide, and a first alkylene oxide in aforesaid sequence, the third alkylene oxide having a longer alkyl chain than the second alkylene oxide and the second alkylene oxide having a longer alkyl chain than the first alkylene oxide. In this way a polyhydric alcohol is formed comprising (at least partly) triblock polyoxyalkylene copolymer side chains.

The advantage of the additives according to the present invention is their suppressing capability that result in a extraordinarily pronounced bottom-up fill copper growth while perfectly suppressing the sidewall copper growth, both leading to a flat growth front and thus providing substantially defect free trench or via fill. The strong sidewall copper growth suppression of the invention enables non-conformal copper seeded features to be substantially void free filled. Moreover the invention provides an overall homogeneous bottom-up fill in neighboring features of dense feature areas.

The additives according to the present invention are particularly useful for filling of small features, particularly those having aperture sizes of 30 nanometer or below.

BRIEF DESCRIPTION OF THE DRAWINGS

A more complete appreciation of the invention and many of the attendant advantages thereof will be readily obtained as the same become better understood by reference to the following detailed description when considered in connection with the accompanying drawings, wherein:

FIGS. 6a and 6b show SEM images of comparative electroplated copper layers.

Figure 1A:
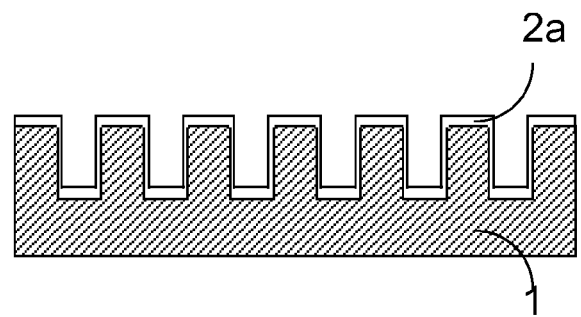
FIG. 1a show a dielectric substrate seeded with a copper layer.

The additives are generally obtainable by reacting a polyhydric alcohol (also referred to as polyalcohol) comprising at least 5 hydroxyl groups with the alkylene oxides either from a mixture or in sequence. In this way the hydroxyl groups of the polyalcohol are etherified to generate polyoxyalkylene side chains.

In a preferred composition suitable polyalcohols are represented by formula (I)

$$X(OH)_m \quad (I)$$

wherein
m is an integer from 5 to 10, preferably 5 to 6,
X is an m-valent linear or branched aliphatic or cycloaliphatic radical having from 5 to 10 carbon atoms which may be substituted or unsubstituted.

It is preferred that the polyalcohol is a linear monosaccharide alcohol represented by formula (II)

$$HOCH_2-(CHOH)_n-CH_2OH \quad (II)$$

wherein n is an integer from 3 to 8. Examples of corresponding monosaccharide alcohols (II) comprise sorbitol, mannitol, xylitol, ribitol as well as their stereo isomers, and the like. A particularly preferred monosaccharide alcohol (II) is sorbitol.

It is further preferred that the polyalcohol is a cyclic monosaccharide alcohol represented by formula (III)

$$(CHOH)_o \quad (III)$$

wherein o is an integer from 5 to 10. Examples of corresponding monosaccharide alcohols (III) comprise inositol (cyclohexanehexyle).

In a further composition suitable polyalcohols are monosaccharides and their stereo isomers. Preferred monosaccharides are monosaccharide aldoses of formula (IV)

$$CHO-(CHOH)_p-CH_2OH \quad (IV)$$

wherein p is an integer of 4 to 5. Examples of corresponding monosaccharide aldoses (IV) are allose, altrose, galactose, glucose, gulose, idose, mannose, talose, glucoheptose, mannoheptose and the like. A very preferred monosaccharide aldose (IV) is glucose.

Particularly preferred monosaccharides are monosaccharide ketoses (V)

$$CH_2OH-(CHOH)_q-CO-(CHOH)_r-CH_2OH \quad (V)$$

wherein q and r are integers and q+r is 3 or 4. Examples of corresponding monosaccharide ketoses (V) are fructose, psicose, sorbose, tagatose, mannoheptulose, sedoheptulose, taloheptulose, alloheptulose and the like. A particularly preferred monosaccharide ketose (V) is fructose and derivatives thereof.

In one embodiment suitable polyalcohols are selected from disaccharides. Particularly preferred disaccharides are sucrose and maltose, and derivatives thereof.

The additives according to the present invention, further also referred to as polyalkoxylated polyalcohols, are particular reaction products of polyalcohols and alkylene oxides. Polyalkoxylated polyalcohols can be received by reacting the OH groups present in the polyalcohol with alkylene oxides to form terminal polyether groups comprising the respective oxyalkylene units. Polyalkoxylated polyalcohols are per se known in the art.

Generally, suitable alkylene oxides may be $C_2$- to $C_{12}$-alkylene oxides or styrene oxide, without being limited thereto. Examples of corresponding alkylene oxides comprise ethylene oxide and propylene oxide, 1-butene oxide, 2,3-butene oxide, 2-methyl-1,2-propene oxide (isobutene oxide), 1-pentene oxide, 2,3-pentene oxide, 2-methyl-1,2-butene oxide, 3-methyl-1,2-butene oxide, 2,3-hexene oxide, 3,4-hexene oxide, 2-methyl-1,2-pentene oxide, 2-ethyl-1,2-butene oxide, 3-methyl-1,2-pentene oxide, decene oxide, 4-methyl-1,2-pentene oxide or styrene oxide.

Preference is given to using alkylene oxide(s) selected from ethylene oxide, propylene oxide and butylene oxide, or combinations thereof. Preferably the content of ethylene oxide in the copolymer of ethylene oxide and other alkylene oxide(s) is from 10 to 90% by weight, more preferably from 20 to 50% by weight, most preferably from 25 to 40% by weight.

Preferably the first alkylene oxide is ethylene oxide and the second alkylene oxide is selected from propylene oxide and butylene oxide, or combinations thereof. Most preferably the second alkylene oxide is propylene oxide.

Preferably the additive is a random copolymer of ethylene oxide and propylene oxide.

Preferably, higher alkylene oxides are generally used, at most, in small amounts for fine adjustment of the properties. In general, the amount of ethylene oxide and/or propylene oxide and/or butylene oxide is at least 80% by weight, preferably at least 90%, most preferably 100% by weight based on the sum of all alkylene oxides used.

In case of a block copolymer the third alkylene oxide is preferably butylene oxide.

Preferably the third alkylene oxide is present in an amount of 0.1% by weight to 10% by weight, preferably from 0.5% by weight to 5.0% by weight.

Most preferably the alkylene oxide is selected from mixtures of ethylene oxide and propylene oxide. A preferred weight ratio of oxyethylene and oxypropylene units in the final product is 10:90 to 90:10, more preferred is 20:80 to 50:50, most preferred are 25:75 to 40:60.

Preferably, the molecular weight $M_w$ of polyalkoxylated polyalcohols is from 500 to 30000 g/mol, more preferred from 1000 to 20000 g/mol, more preferred from 2000 to 15000 g/mol and even more preferred from 3000 to 10000 g/mol. Most preferred is a molecular weight of from 4000 to 8000 g/mol.

The average degree of polyoxyalkylation is from about 10 to about 500, preferably from about 30 to about 400, more preferably from about 50 to about 300, most preferably from about 60 to about 200 alkylene oxide units per polyalcohol starter.

The synthesis of polyoxyalkylenes is known to those skilled in the art. Comprehensive details are given, for example, in "Polyoxyalkylenes" in Ullmann's Encyclopedia of Industrial Chemistry, 6th Edition, Electronic Release.

Preference is given to undertaking the polyoxyalkylation in the presence of a customary basic catalyst, for example alkali metal hydroxides, preferably potassium hydroxide, or alkali metal alkoxides, for example, sodium methoxide or potassium tert-butylate. The polyalkoxylation can be undertaken, in a manner known in principle, in a pressure reactor at from 40 to 250 degree C., preferably from 80 to 200 degree C. and more preferably from 100 to 150 degree C. When the melting point of the polyalcohol exceeds the reaction temperature, the polyalcohol is suspended in an inert solvent before the polyalkoxylation reaction. Suitable solvents are toluene, xylenes, polyether and N,N-dimethylformamide.

The polyalkoxylated polyalcohols may optionally be functionalized in a further reaction step. An additional functionalization can serve to modify the properties of the polyalkoxylated polyalcohols. The terminal hydroxyl groups of the alkoxylated polyalcohols can be reacted with suitable reagents for functionalization, which forms groups of the general formula -(alkoxy)$_s$-Z where Z is any desired group and s is an integer from 1 to 200. According to the functionalizing agent, the chain end can be hydrophobized or more strongly hydrophilized.

The terminal hydroxyl groups can be esterified, for example, with sulfuric acid or derivatives thereof, so as to form products with terminal sulfate groups (sulfatation). Analogously, products having terminal phosphorus groups can be obtained with phosphoric acid, phosphorous acid, polyphosphoric acid, $POCl_3$ or $P_4O_{10}$ (phosphatation).

In addition, the terminal OH groups may also be etherified, so as to form ether-terminated polyalkoxy groups of the general formula -(alkoxy)$_s$-Z, where Z is an alkyl, alkenyl, alkynyl, alkaryl, or aryl group and s is an integer from 1 to 200. Preferably, Z is methyl, ethyl, benzyl, acetyl or benzoyl.

A further embodiment of the present invention is the use of a metal plating bath comprising a composition as described above for depositing the metal on substrates comprising features having an aperture size of 30 nanometers or less.

A further embodiment of the present invention is a process for depositing a metal layer on a substrate by
 a) contacting a metal plating bath comprising a composition according to the present invention with the substrate, and
 b) applying a current density to the substrate for a time sufficient to deposit a metal layer onto the substrate.

Preferably the substrate comprises submicrometer sized features and the deposition is performed to fill the submicrometer sized features. Most preferably the submicrometer-sized features have an (effective) aperture size from 1 to 30 nanometers and/or an aspect ratio of 4 or more. More preferably the features have an aperture size of 25 nanometers or below, most preferably of 20 nanometers or below.

The aperture size according to the present invention means the smallest diameter or free distance of a feature before plating, i.e. after copper seed deposition. The terms "aperture" and "opening" are used herein synonymously. A convex shape is a feature having an aperture size being at least 25%, preferably 30%, most preferably 50% smaller than the biggest diameter or free distance of the feature before plating.

The plating bath according to the present invention is particular suitable for features having high aspect ratios of 4 or more, particularly of 6 or more.

A wide variety of metal plating baths may be used with the present invention. Metal electroplating baths typically contain a metal ion source, an electrolyte, and a polymeric suppressing agent.

The metal ion source may be any compound capable of releasing metal ions to be deposited in the electroplating bath in sufficient amount, i.e. is at least partially soluble in the electroplating bath. It is preferred that the metal ion source is soluble in the plating bath. Suitable metal ion sources are metal salts and include, but are not limited to, metal sulfates, metal halides, metal acetates, metal nitrates, metal fluoroborates, metal alkylsulfonates, metal arylsulfonates, metal sulfamates, metal gluconates and the like. It is preferred that the metal is copper. It is further preferred that the source of metal ions is copper sulfate, copper chloride, copper acetate, copper citrate, copper nitrate, copper fluoroborate, copper methane sulfonate, copper phenyl sulfonate and copper p-toluene sulfonate. Copper sulfate pentahydrate and copper methane sulfonate are particularly preferred. Such metal salts are generally commercially available and may be used without further purification.

Besides metal electroplating the compositions may be used in electroless deposition of metal containing layers. The compositions may particularly used in the deposition of barrier layers containing Ni, Co, Mo, W and/or Re. In this case, besides metal ions, further elements of groups III and V, particularly B and P may be present in the composition for electroless deposition and thus co-deposited with the metals.

The metal ion source may be used in the present invention in any amount that provides sufficient metal ions for electroplating on a substrate. Suitable metal ion sources include, but are not limited to, tin salts, copper salts, and the like. When the metal is copper, the copper salt is typically present in an amount in the range of from about 1 to about 300 g/L of plating solution. It will be appreciated mixtures of metal salts may be electroplated according to the present invention. Thus, alloys, such as copper-tin having up to about 2 percent by weight tin, may be advantageously plated according to the present invention. The amounts of each of the metal salts in such mixtures depend upon the particular alloy to be plated and is well known to those skilled in the art.

In general, besides the metal ion source and at least one of the suppressing agents according to the present invention the present metal electroplating compositions preferably include electrolyte, i.e. acidic or alkaline electrolyte, one or more sources of metal ions, optionally halide ions, and optionally other additives like accelerators and/or levelers. Such baths are typically aqueous. The water may be present in a wide range of amounts. Any type of water may be used, such as distilled, deionized or tap.

The electroplating baths of the present invention may be prepared by combining the components in any order. It is preferred that the inorganic components such as metal salts, water, electrolyte and optional halide ion source, are first added to the bath vessel followed by the organic components such as leveling agents, accelerators, suppressors, surfactants and the like.

Typically, the plating baths of the present invention may be used at any temperature from 10 to 65 degrees C. or higher. It is preferred that the temperature of the plating baths is from 10 to 35 degrees C. and more preferably from 15 degrees to 30 degrees C.

Suitable electrolytes include such as, but not limited to, sulfuric acid, acetic acid, fluoroboric acid, alkylsulfonic acids such as methanesulfonic acid, ethanesulfonic acid, propanesulfonic acid and trifluoromethane sulfonic acid, arylsulfonic acids such as phenyl sulfonic acid and toluenesulfonic acid, sulfamic acid, hydrochloric acid, phosphoric acid, tetraalkylammonium hydroxide, preferably tetramethylammonium hydroxide, sodium hydroxide, potassium hydroxide and the like. Acids are typically present in an amount in the range of from about 1 to about 300 g/l, alkaline electrolytes are typically present in an amount of about 0.1 to about 20 g/l or to yield a pH of 8 to 13 respectively, and more typically to yield a pH of 9 to 12.

Such electrolytes may optionally contain a source of halide ions, such as chloride ions as in copper chloride or hydrochloric acid. A wide range of halide ion concentrations may be used in the present invention such as from about 0 to about 500 ppm. Typically, the halide ion concentration is in the range of from about 10 to about 100 ppm based on the plating bath. It is preferred that the electrolyte is sulfuric acid or methanesulfonic acid, and preferably a mixture of sulfuric acid or methanesulfonic acid and a source of chloride ions. The acids and sources of halide ions useful in the present invention are generally commercially available and may be used without further purification.

Preferably the composition further comprises at least one accelerating agent and/or at least one leveling agent.

Any accelerators may be advantageously used in the plating baths according to the present invention. Accelerators useful in the present invention include, but are not limited to, compounds comprising one or more sulphur atom and a sulfonic/phosphonic acid or their salts.

The generally preferred accelerators have the general structure $MO_3X—R^{21}—(S)_u—R^{22}$, with:
M is a hydrogen or an alkali metal (preferably Na or K)
X is P or S
u=1 to 6
$R^{21}$ is selected from C1-C8 alkyl group or heteroalkyl group, an aryl group or a heteroaromatic group. Heteroalkyl groups will have one or more heteroatom (N, S, O) and 1-12 carbon atoms. Carbocyclic aryl groups are typical aryl groups, such as phenyl, naphtyl. Heteroaromatic groups are also suitable aryl groups and contain one or more N, O or S atom and 1-3 separate or fused rings.
$R^{22}$ is selected from H or ($—S—R^{21'}XO_3M$), with $R^{21'}$ being identical or different from $R^{21}$.

More specifically, useful accelerators include those of the following formulae:

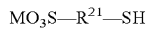
$MO_3S—R^{21}—SH$

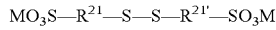
$MO_3S—R^{21}—S—S—R^{21'}—SO_3M$

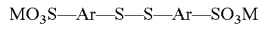
$MO_3S—Ar—S—S—Ar—SO_3M$ with $R^{21}$ and $R^{21'}$ are as defined above and Ar is Aryl.
Particularly preferred accelerating agents are:
SPS: bis-(3-sulfopropyl)-disulfide disodium salt
MPS: 3-mercapto-1-propansulfonic acid, sodium salt Other examples of accelerators, used alone or in mixture, include, but are not limited to: MES (2-Mercaptoethanesulfonic acid, sodium salt); DPS(N,N-dimethyldithiocarbamic acid (3-sulfopropylester), sodium salt); UPS (3-[(amino-iminomethyl)-thio]-1-propylsulfonic acid); ZPS (3-(2-benzthiazolylthio)-1-propanesulfonic acid, sodium salt); 3-mercapto-propylsulfonicacid-(3-sulfopropyl)ester; methyl-($\omega$-sulphopropyl)-disulfide, disodium salt; methyl-($\omega$-sulphopropyl)-trisulfide, disodium salt.

Such accelerators are typically used in an amount of about 0.1 ppm to about 3000 ppm, based on the total weight of the plating bath. Particularly suitable amounts of accelerator useful in the present invention are 1 to 500 ppm, and more particularly 2 to 100 ppm.

Any additional suppressor may be advantageously used in the present invention. Suppressors useful in the present invention include, but are not limited to, polymeric materials, particularly those having heteroatom substitution, and more particularly oxygen substitution. Suitable suppressors include polyethylene glycol copolymers, particularly polyethylene glycol polypropylene glycol copolymers. The arrangement of ethylene oxide and propylene oxide of suitable suppressors may be block, alternating, gradient, or random. The polyalkylene glycol may comprise further alkylene oxide building blocks such as butylene oxide. Preferably, the average molecular weight of suitable suppressors exceeds about 2000 g/mol. The starting molecules of suitable polyalkylene glycol may be alkyl alcohols such as methanol, ethanol, propanol, n-butanol and the like, aryl alcohols such as phenols and bisphenols, alkaryl alcohols such as benzyl alcohol, polyol starters such as glycol, glycerin, trimethylol propane, pentaerythritol, sorbitol, carbohydrates such as saccharose, and the like, amines and oligoamines such as alkyl amines, aryl amines such as aniline, triethanol amine, ethylene diamine, and the like, amides, lactams, heterocyclic amines such as imidazol and carboxylic acids. Optionally, polyalkylene glycol suppressors may be functionalized by ionic groups such as sulfate, sulfonate, ammonium, and the like.

When suppressors are used, they are typically present in an amount in the range of from about 1 to about 10,000 ppm based on the weight of the bath, and preferably from about 5 to about 10,000 ppm.

Leveling agents can advantageously be used in the metal plating baths according to the present invention. The terms "leveling agent" and "leveler" are used herein synonymously.

Suitable leveling agents include, but are not limited to, one or more of polyethylene imine and derivatives thereof, quaternized polyethylene imine, polyglycine, poly(allylamine), polyaniline, polyurea, polyacrylamide, poly(melamine-co-formaldehyde), reaction products of amines with epichlorohydrin, reaction products of an amine, epichlorohydrin, and polyalkylene oxide, reaction products of an amine with a polyepoxide, polyvinylpyridine, polyvinylimidazole, polyvinylpyrrolidone, or copolymers thereof, nigrosines, pentamethyl-para-rosaniline hydrohalide, hexamethyl-pararosaniline hydrohalide, trialkanolamines and their derivatives or compounds containing a functional group of the formula N—R—S, where R is a substituted alkyl, unsubstituted alkyl, substituted aryl or unsubstituted aryl. Typically, the alkyl groups are (C1-C6)alkyl and preferably (C1-C4)alkyl. In general, the aryl groups include (C6-C20)aryl, preferably (C6-C10)aryl. Such aryl groups may further include heteroatoms, such as sulfur, nitrogen and oxygen. It is preferred that the aryl group is phenyl or napthyl. The compounds containing a functional group of the formula N—R—S are generally known, are generally commercially available and may be used without further purification.

In such compounds containing the N—R—S functional group, the sulfur ("S") and/or the nitrogen ("N") may be attached to such compounds with single or double bonds. When the sulfur is attached to such compounds with a single bond, the sulfur will have another substituent group, such as but not limited to hydrogen, (C1-C12)alkyl, (C2-C12)alkenyl, (C6-C20)aryl, (C1-C12)alkylthio, (C2-C12)alkenylthio, (C6-C20)arylthio and the like. Likewise, the nitrogen will have one or more substituent groups, such as but not limited to hydrogen, (C1-C12)alkyl, (C2-C12)alkenyl, (C7-C10)aryl, and the like. The N—R—S functional group may be acyclic or cyclic. Compounds containing cyclic N—R—S functional groups include those having either the nitrogen or the sulfur or both the nitrogen and the sulfur within the ring system.

By "substituted alkyl" is meant that one or more of the hydrogens on the alkyl group is replaced with another substituent group, such as, but not limited to, cyano, hydroxyl, halo, (C1-C6)alkoxy, (C1-C6)alkylthio, thiol, nitro, and the like. By "substituted aryl" is meant that one or more hydrogens on the aryl ring are replaced with one or more substituent groups, such as, but not limited to, cyano, hydroxyl, halo, (C1-C6)alkoxy, (C1-C6)alkyl, (C2-C6)alkenyl, (C1-C6)alkylthio, thiol, nitro, and the like. "Aryl" includes carbocyclic and heterocyclic aromatic systems, such as, but not limited to, phenyl, naphthyl and the like.

Polyalkanolamines, alkoxylated polyalkanolamines, functionalized polyalkanolamines, and functionalized alkoxylated polyalkanolamines are particularly preferred levelling agents in copper electroplating baths. Such Polyalkanolamines are described in European patent application No. 08172330.6, which is incorporated herein by reference.

Polyalkanolamines can be obtained by condensing at least one trialkanolamine of the general formula $N(R^{11}—OH)_3$ (XIa) and/or at least one dialkanolamine of the general formula $R^{12}—N/R^{11}—OH)_2$ (XIb) to give a polyalkanolamine (XII) (stage A), where the $R^{11}$ radicals are each independently selected from a divalent, linear and branched aliphatic hydrocarbon radical having from 2 to 6 carbon atoms, and the $R^{12}$ radicals are each selected from hydrogen and aliphatic, cycloaliphatic and aromatic hydrocarbon radicals, all of which may be linear or branched, having from 1 to 30 carbon atoms.

The alkanolamine can be used as such or may optionally be alkoxylated, functionalized or alkoxylated and functionalized to get alkoxylated polyalkanolamines (XIII), functionalized polyalkanolamines (XIV) or functionalized alkoxylated polyalkanolamines (XV).

Alkoxylated polyalkanolamines (XIII) can be obtained by alkoxylating polyalkanolamine (XII) with $C_2$- to $C_{12}$-alkylene oxides, styrene oxide, glycidol, or glycidyl ethers with the proviso that the average degree of alkoxylation is from 0.1 to 200 per OH group and—where present—secondary amino group (stage B).

Functionalized polyalkanolamines (XIV) can be obtained by functionalizing polyalkanolamine (XII) with suitable functionalization reagents which are capable of reaction with hydroxyl groups and/or amino groups (stage C).

Functionalized alkoxylated polyalkanolamines (XV) can be obtained by functionalizing alkoxylated polyalkanolamine (XIII) with suitable functionalization reagents which are capable of reaction with hydroxyl groups and/or amino groups (stage D).

The trialkanolamines (XIa) and/or dialkanolamines (XIb) used in stage (A) have the general formulae $N(R^{11}—OH)_3$ (XIa) and $R^{12}—N(R^{11}—OH)_2$ (XIb).

The $R^{11}$ radicals are in each case independently a divalent linear or branched aliphatic hydrocarbon radical having from 2 to 6 carbon atoms, preferably 2 or 3 carbon atoms. Examples of such radicals comprise ethane-1,2-diyl, propane-1,3-diyl, propane-1,2-diyl, 2-methylpropane-1,2-diyl, 2,2-dimethylpropane-1,3-diyl, butane-1,4-diyl, butane-1,3-diyl (=1-methylpropane-1,3-diyl), butane-1,2-diyl, butane-2,3-diyl, 2-methylbutane-1,3-diyl, 3-methylbutane-1,3-diyl (=1,1-dimethylpropane-1,3-diyl), pentane-1,4-diyl, pentane-1,5-diyl, pentane-2,5-diyl, 2-methylpentane-2,5-diyl (=1,1-dimethylbutane-1,3-diyl) and hexane-1,6-diyl. The radicals are preferably ethane-1,2-diyl, propane-1,3-diyl or propane-1,2-diyl.

The $R^{12}$ radical is hydrogen and/or linear or branched aliphatic, cycloaliphatic and/or aromatic hydrocarbon radicals having from 1 to 30 carbon atoms, preferably from 1 to 20 carbon atoms and more preferably from 1 to 10 carbon atoms. Aromatic radicals may of course also have aliphatic substituents. $R^{12}$ is preferably hydrogen or aliphatic hydrocarbon radicals having from 1 to 4 carbon atoms.

Examples of preferred trialkanolamines (XIa) comprise triethanolamine, triisopropanolamine and tributan-2-olamine, particular preference is given to triethanolamine.

Examples of preferred dialkanolamines (XIb) comprise diethanolamine, N-methyl-diethanolamine, N,N-bis(2-hydroxypropyl)-N-methylamine, N,N-bis(2-hydroxybutyl)-N-methylamine, N-isopropyldiethanolamine, N-n-butyldiethanolamine, N-sec-butyldiethanolamine, N-cyclohexyldiethanolamine, N-benzyldiethanolamine, N-4-tolyldiethanolamine or N,N-bis(2-hydroxyethyl)aniline. Particular preference is given to diethanolamine.

In addition to the trialkanolamines (XIa) and/or dialkanolamines (XIb) it is optionally possible to use further components (XIc) having two hydroxyl and/or amino groups for the polycondensation.

The polycondensation of components (XIa) and/or (XIb) and optionally (XIc) can be carried out by methods known in principle to those skilled in the art while heating the components, with elimination of water. Suitable methods are disclosed, for example, by EP 441 198 A2. It will be appreciated that it is in each case also possible to use mixtures of different components (XIa), (XIb) or (XIc).

The condensation is performed typically at temperatures of from 120 to 280 degree C., preferably from 150 to 260 degree C. and more preferably from 180 to 240 degree C. The water formed is preferably distilled off. The reaction time is typically from 1 to 16 h, preferably from 2 to 8 h. The degree of condensation can be controlled in a simple manner through the reaction temperature and time.

The polycondensation is preferably carried out in the presence of an acid, preferably phosphorous acid ($H_3PO_3$) and/or hypophosphorous acid ($H_3PO_2$). Preferred amounts are from 0.05 to 2% by weight, preferably from 0.1 to 1% by weight, based on the components to be condensed. In addition to the acid, it is also possible to use additional catalysts, for example, zinc halides or aluminum sulfate, if appropriate in a mixture with acetic acid, as disclosed, for example by U.S. Pat. No. 4,505,839.

The viscosity of the resulting polyalkanolamines (XII) is typically in the range from 1000 to 50 000 mPa·s, preferably from 2000 to 20 000 mPa·s and more preferably from 3000 to 13000 mPa·s (each measured on the undiluted product at 20 degree C.).

The mean molar mass $M_n$ (number average) of the resulting polyalkanolamines (XII) is typically in the range from 250 to 50 000 g/mole, preferably from 500 to 40 000 g/mole, more preferably from 1000 to 20 000 g/mole and most preferably from 1000 to 7500 g/mole.

The mean molar mass $M_w$ (weight average) of the resulting polyalkanolamines (XII) is typically in the range from 250 to 50 000 g/mole, preferably from 500 to 30 000 g/mole, more preferably from 1000 to 20 000 g/mole.

The resulting polyalkanolamine (XII) preferably has a polydispersity ($M_w/M_n$) in the range of 1 to 10, and in particular in the range of 1 to 5.

The polyalkanolamines (XII) can optionally be alkoxylated in a second stage (B). In this step, the OH groups and any secondary amino groups present react with alkylene oxides to form terminal polyether groups.

Polyalkanolamines (XII) can optionally be functionalized in a further reaction step (C). An additional functionalization can serve to modify the properties of the polyalkanolamines (XII). To this end, the hydroxyl groups and/or amino groups present in the polyalkanolamines (XII) are converted by means of suitable agents which are capable of reaction with hydroxyl groups and/or amino groups. This forms functionalized polyalkanolamines (XIV).

The alkoxylated polyalkanolamines (XIII) can optionally be functionalized in a further reaction step (D). An additional functionalization can serve to modify the properties of the alkoxylated polyalkanolamines (XIII). To this end, the hydroxyl groups and/or amino groups present in the alkoxylated polyalkanolamines (XIII) are converted by means of suitable agents which are capable of reaction with hydroxyl groups and/or amino groups. This forms functionalized alkoxylated polyalkanolamines (XV).

In general, the total amount of leveling agents in the electroplating bath is from 0.5 ppm to 10000 ppm based on the total weight of the plating bath. The leveling agents according to the present invention are typically used in a total amount of from about 0.1 ppm to about 1000 ppm based on the total weight of the plating bath and more typically from 1 to 100 ppm, although greater or lesser amounts may be used.

The electroplating baths according to the present invention may include one or more optional additives. Such optional additives include, but are not limited to, accelerators, suppressors, surfactants and the like. Such suppressors and accelerators are generally known in the art. It will be clear to one skilled in the art which suppressors and/or accelerators to use and in what amounts.

A large variety of additives may typically be used in the bath to provide desired surface finishes for the Cu plated metal. Usually more than one additive is used with each additive forming a desired function. Advantageously, the electroplating baths may contain one or more of accelerators, levelers, sources of halide ions, grain refiners and mixtures thereof. Most preferably the electroplating bath contains both, an accelerator and a leveler in addition to the suppressor according to the present invention. Other additives may also be suitably used in the present electroplating baths.

The present invention is useful for depositing a metal layer, particularly a copper layer, on a variety of substrates, particularly those having submicron and variously sized apertures. For example, the present invention is particularly suitable for depositing copper on integrated circuit substrates, such as semiconductor devices, with small diameter vias, trenches or other apertures. In one embodiment, semiconductor devices are plated according to the present invention. Such semiconductor devices include, but are not limited to, wafers used in the manufacture of integrated circuits.

The general process of copper electrodeposition on semiconductor integrated circuit substrates is described with respect to FIGS. 1 and 2 without restricting the invention thereto.

Figure 1B:
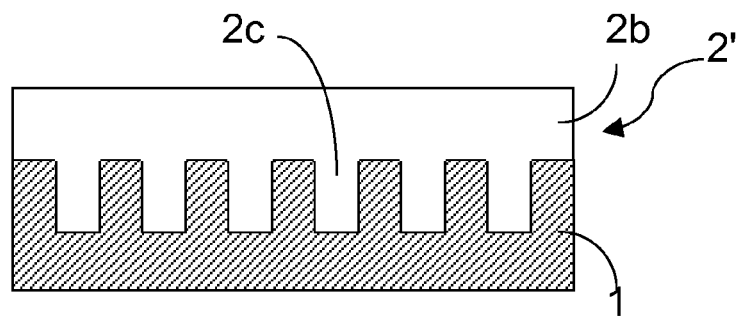
FIG. 1b shows a copper layer deposited onto the dielectric substrate.
Figure 1C:
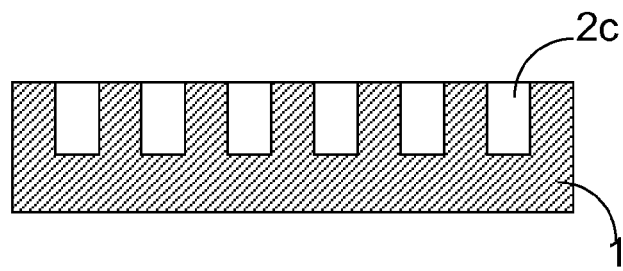
FIG. 1c shows the removal of copper by chemical mechanical planarization.

FIG. 1a shows a dielectric substrate 1 seeded with a copper layer 2a. With reference to FIG. 1b a copper layer 2' is deposited onto the dielectric substrate 1 by electrodeposition. The trenches 2c of the substrate 1 are filled and an overplating of copper 2b, also referred to as "overburden", is generated on top of the whole structured substrate. During the process, after optional annealing, the overburden of copper 2b is removed by chemical mechanical planarization (CMP), as depicted in FIG. 1c.

Figure 2A:
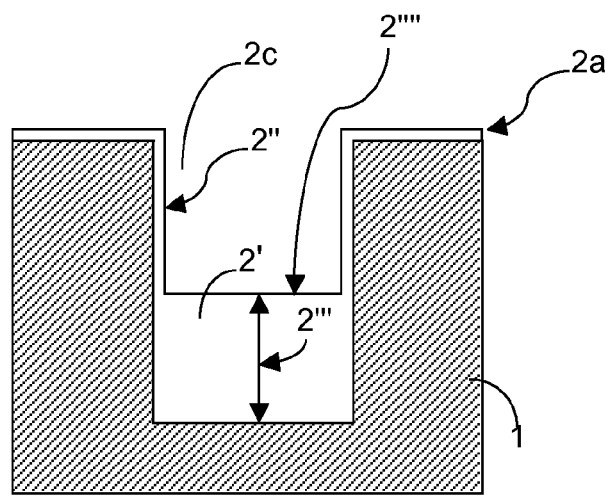
FIG. 2a shows bottom-up filling of a trench.

A key aspect when filling the trenches 2c of the substrate 1 with copper by electrodeposition is to achieve a copper layer that is free of defects, especially free of voids and seams. This can be realized by initiating the copper growth at the bottom of the trench with the copper growing up to the mouth of the trench while suppressing copper growth at the sidewalls of the trench. This manner of trench filling, the so-called super-filling or bottom-up-filling, depicted in FIG. 2a, is sought to achieve by adding certain additives to the plating bath: the accelerator and the suppressor. It is a sensitive interplay between these two additives that has to be carefully adjusted to obtain a trench filling free of any defects.

Figure 2B:
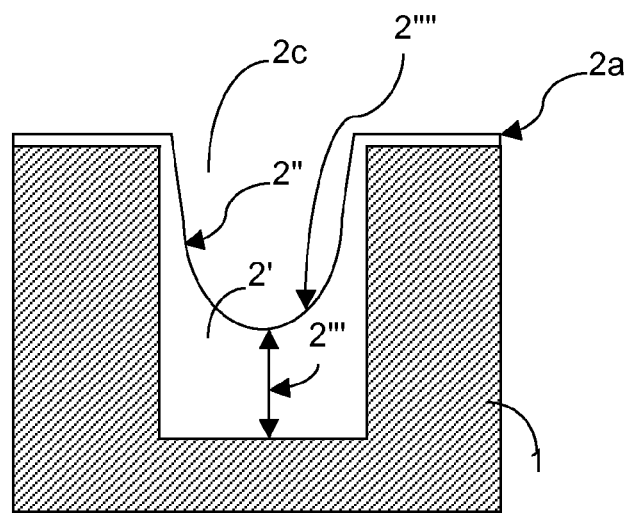
FIG. 2b shows copper growth in a perfectly conformal copper seeded trench.
Figure 2C:
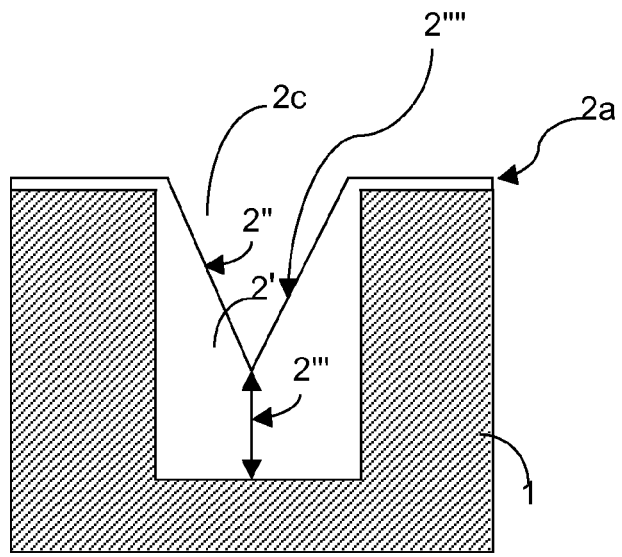
FIG. 2c shows a V-shaped growth front due to significant sidewall copper growth.
Figure 3:
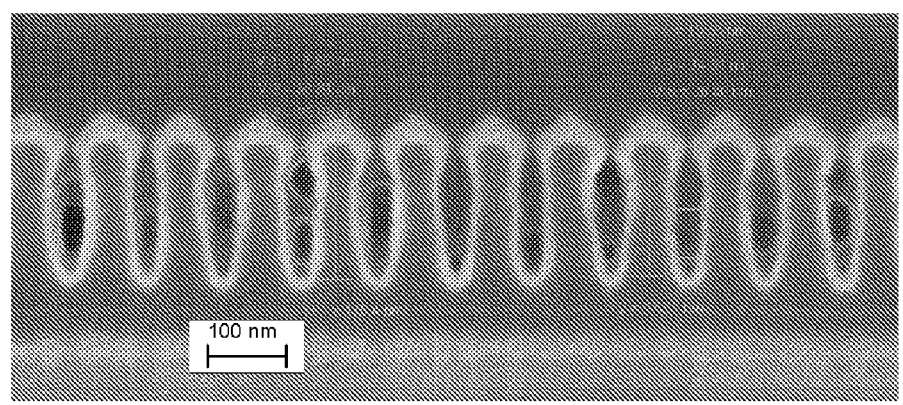
FIG. 3 shows a seeded substrate exhibiting impact of the seed on the opening of the features to be filled.

Bottom-up-filling as shown in FIG. 2a can be achieved with the accelerator preferably accumulating and adsorbing on the copper bottom of the trench and thus boosting the copper growth 2''', and with the suppressor adsorbing on the sidewalls of the trench suppressing the copper growth 2''. Depending on the chemical structure of the suppressor and thus on its suppressing ability, the trench filling can proceed with variably shaped copper growth fronts 2''', depicted in FIGS. 2a to 2c. A perfectly working suppressor with complete sidewall coverage and full sidewall growth suppression 2'' is shown in FIG. 2a. In this case the growth front 2''' is flat with solely growing bottom-up copper 2'''. A less effective suppressor results in a copper growth front 2''' depicted in FIG. 2b. Slight sidewall copper growth 2'' with predominant bottom-up copper growth 2''' gives an overall U-shaped growth front 2'''. A weak suppressor evolves a V-shaped growth front 2''' due to significant sidewall copper growth 2'', as depicted in FIG. 2c. A V-shaped copper growth front 2''' implicates a serious risk of void formation when the trench is filled. With a perfectly conformal copper seeded trench the U-shaped copper growth front 2''' as shown in FIG. 2b might provide satisfying trench filling. But since there is an increasing seed overhang issue and/or convex-shaped features with further shrinking feature sizes, as depicted in FIG. 3, there is a serious risk of pinch-off void formation in the upper half of the trench close to the opening if the suppressor does not completely avoid sidewall copper growth 2''. The present invention provides a new class of highly effective, strong suppressing agents that cope with the seed overhang issue and provide defect free trench filling despite a non-conformal copper seed.

The advantage of the invention is that suppressing agents are provided that result in a extraordinarily pronounced bottom-up fill copper growth while perfectly suppressing the sidewall copper growth, both leading to a flat growth front and thus providing defect free trench fill. The strong sidewall copper growth suppression of the invention enables non-conformal copper seeded features and/or convex-shaped features to be substantially void free filled. Moreover the invention provides an overall homogeneous bottom-up fill in neighboring features of dense feature areas.

The additives according to the present invention can further advantageously be used for electroplating of copper in through silicon vias (TSV). Such vias normally have diameters of several micrometers up to 100 micrometers and large aspect ratios of at least 4, sometimes above 10. Furthermore the additives according to the present invention can advantageously be used in bonding technologies such as the manufacture of copper pillars of typically 50 to 100 micrometers height and diameter for the bumping process, in circuit board technologies like the manufacture of high-density-interconnects on printed circuit boards using microvia plating or plated-through-hole technologies, or in other packaging processes for electronic circuits.

Typically, substrates are electroplated by contacting the substrate with the plating baths of the present invention. The substrate typically functions as the cathode. The plating bath contains an anode, which may be soluble or insoluble. Optionally, cathode and anode may be separated by a membrane. Potential is typically applied to the cathode. Sufficient current density is applied and plating performed for a period of time sufficient to deposit a metal layer, such as a copper layer, having a desired thickness on the substrate. Suitable current densities include, but are not limited to, the range of 1 to 250 mA/cm$^2$. Typically, the current density is in the range of 1 to 60 mA/cm$^2$ when used to deposit copper in the manufacture of integrated circuits. The specific current density depends on the substrate to be plated, the leveling agent selected and the like. Such current density choice is within the abilities of those skilled in the art. The applied current may be a direct current (DC), a pulse current (PC), a pulse reverse current (PRC) or other suitable current.

In general, when the present invention is used to deposit metal on a substrate such as a wafer used in the manufacture of an integrated circuit, the plating baths are agitated during use. Any suitable agitation method may be used with the present invention and such methods are well-known in the art. Suitable agitation methods include, but are not limited to, inert gas or air sparging, work piece agitation, impingement and the like. Such methods are known to those skilled in the art. When the present invention is used to plate an integrated circuit substrate, such as a wafer, the wafer may be rotated such as from 1 to 150 RPM and the plating solution contacts the rotating wafer, such as by pumping or spraying. In the alternative, the wafer need not be rotated where the flow of the plating bath is sufficient to provide the desired metal deposit.

Metal, particularly copper, is deposited in apertures according to the present invention without substantially forming voids within the metal deposit. By the term "without substantially forming voids", it is meant that 95% of the plated apertures are void-free. It is preferred that 98% of the plated apertures are void-free, mostly preferred is that all plated apertures are void-free.

While the process of the present invention has been generally described with reference to semiconductor manufacture, it will be appreciated that the present invention may be useful in any electrolytic process where metal filled small features that are substantially free of voids are desired. Such processes include printed wiring board manufacture. For example, the present plating baths may be useful for the plating of vias, pads or traces on a printed wiring board, as well as for bump plating on wafers. Other suitable processes include packaging and interconnect manufacture. Accordingly, suitable substrates include lead frames, interconnects, printed wiring boards, and the like.

Plating equipment for plating semiconductor substrates are well known. Plating equipment comprises an electroplating tank which holds Cu electrolyte and which is made of a suitable material such as plastic or other material inert to the electrolytic plating solution. The tank may be cylindrical, especially for wafer plating. A cathode is horizontally disposed at the upper part of tank and may be any type substrate such as a silicon wafer having openings such as trenches and vias. The wafer substrate is typically coated with a seed layer of Cu or other metal or a metal containing layer to initiate plating thereon. A Cu seed layer may be applied by chemical vapor deposition (CVD), physical vapor deposition (PVD), or the like. An anode is also preferably circular for wafer plating and is horizontally disposed at the lower part of tank forming a space between the anode and cathode. The anode is typically a soluble anode.

These bath additives are useful in combination with membrane technology being developed by various tool manufacturers. In this system, the anode may be isolated from the organic bath additives by a membrane. The purpose of the separation of the anode and the organic bath additives is to minimize the oxidation of the organic bath additives.

The cathode substrate and anode are electrically connected by wiring and, respectively, to a rectifier (power supply). The cathode substrate for direct or pulse current has a net negative charge so that Cu ions in the solution are reduced at the cathode substrate forming plated Cu metal on the cathode surface. An oxidation reaction takes place at the anode. The cathode and anode may be horizontally or vertically disposed in the tank.

Metal, particularly copper, is deposited in apertures according to the present invention without substantially forming voids within the metal deposit. By the term "without substantially forming voids", it is meant that 95% of the plated apertures are void-free. It is preferred that the plated apertures are void-free.

While the process of the present invention has been generally described with reference to semiconductor manufacture, it will be appreciated that the present invention may be useful in any electrolytic process where a substantially void-free copper deposit is desired. Accordingly, suitable substrates include lead frames, interconnects, printed wiring boards, and the like.

All percent, ppm or comparable values refer to the weight with respect to the total weight of the respective composition except where otherwise indicated. All cited documents are incorporated herein by reference.

The following examples shall further illustrate the present invention without restricting the scope of this invention.

The hydroxyl number was determined according to DIN 53240 by heating the sample in pyridine with acetic acid anhydride and acetic acid, followed by titration with potassium hydroxide.

The molecular weight distribution d was determined by size exclusion chromatography (GPC) with THF as eluent and using PSS SDV columns as solid phase.

EXAMPLES

Three EO-PO copolymers containing a polyalcohol starter have been synthesized by polyalkoxylation of the respective polyalcohol starting molecule. The compositions of suppressors 1-4 are given in Table 1.

TABLE 1

| Suppressor | Starter | m of X(OH)$_m$ | EO number/PO number per starter (theoretical molecular weight [g/mol]) | arrangement | Fill quality |
|---|---|---|---|---|---|
| 1 | sorbitol-1BuO | 6 | 44.3/78.4 (6500) | PO-EO block | + |
| 2 | sorbitol | 6 | 44.3/78.4 (6500) | random | + |

TABLE 1-continued

| Suppressor | Starter | m of X(OH)$_m$ | EO number/PO number per starter (theoretical molecular weight [g/mol]) | arrangement | Fill quality |
|---|---|---|---|---|---|
| 3 (comparative example) | pentaerythritol-3.5 EO | 4 | 44.3/78.4 (6500) | random | – |
| 4 (comparative example) | sorbitol | 6 | 44.3/78.4 (6500) | EO-PO block | – |

Example 1

Sorbitol (182.2 g), an aqueous sodium hydroxide solution (concentration: 50 w % NaOH; 1.8 g) and water (200 ml) were placed into a 2 l autoclave and heated at 120° C. under a constant nitrogen flow (0.5 m$^3$ N2/h) for 1 h. Then water was removed at the same temperature in vacuo for 2 h. After nitrogen neutralization butylene oxide (72.1 g) was added in portions at 140° C. To complete the reaction, the mixture was allowed to post-react overnight. Subsequently, propylene oxide (662.0 g) was added in portions at 130° C. and, again, the mixture post-reacted overnight. The magnesium silicate Ambosol (27.6 g, CAS No. 93616-22-9), the filtration support Hyflow (1.8 g) and water (20 ml) were added and volatile compounds were removed at the rotary evaporator at 100° C. in vacuo. After filtration a highly viscous yellow oil (920.7 g) was obtained as an intermediate product.

The intermediate product (203.3 g) and aqueous caesium hydroxide solution (concentration: 50 w % CsOH; 2.2 g) were placed into a 2 l autoclave and water was removed at 120° C. in vacuo for 2 h. After nitrogen neutralization additional propylene oxide (863.2 g) was added in portions at 130° C. To complete the reaction, the mixture was allowed to post-react over weekend. Then, aqueous sodium hydroxide solution (concentration: 50 w % NaOH; 3.0 g) and water (10 ml) were added and water was removed at 120° C. in vacuo for 2 h. After nitrogen neutralization ethylene oxide (433.5 g) was added in portions at 120° C. and the mixture was allowed to post-react overnight. Ambosol (44.7 g), Hyflow (3 g) and water (20 ml) were added and volatile compounds were removed at the rotary evaporator at 100° C. in vacuo. After filtration a light yellow liquid (1491 g) was obtained. Molecular weight distribution d=1.04; OH number 49.4 mg/g KOH.

Example 2

A mixture of sorbitol (30 g), water (30 g) and aqueous caesium hydroxide solution (concentration: 50 w % CsOH; 1.1 g) was stirred overnight. Then this mixture and additional water (20 g) were placed into a 2 l autoclave and water was removed at 100° C. in vacuo (<10 mbar) for 3 h. After nitrogen neutralization a mixture of ethylene oxide (321.4 g) and propylene oxide (750.1 g) was added in portions at 130° C. for 3 d. After stirring for 1 d, the reaction mixture was stripped with nitrogen and volatile compounds were removed in vacuo. Suppressor 2 was obtained as a light yellow liquid (1108 g) having a molecular weight distribution d=1.08.

Example 3

A mixture of pentaerythritol-3.5 EO (40 g; from Aldrich, CAS: 30599-15-6), water (10 g) and aqueous caesium hydroxide solution (concentration: 50 w % CsOH; 2.0 g) was stirred overnight. Then this mixture and additional water (20 g) were placed into a 2 l autoclave and water was removed at 100° C. in vacuo (<10 mbar) for 2 h. After nitrogen neutralization a mixture of ethylene oxide (282.9 g) and propylene oxide (660.4 g) was added in portions at 130° C. for 4 h at the reaction mixture was stirred for additional 10 h. Then, the reaction mixture was stripped with nitrogen and volatile compounds were removed in vacuo. Suppressor 3 was obtained as a yellow liquid (951 g) having a molecular weight distribution d=1.12.

FIG. 3 shows the feature sizes of the copper seeded wafer substrate that was used for electroplating with the different plating baths described in the following sections. After copper seed deposition the trenches had a width of 15.6 to 17.9 nanometer at the trench opening, a width of 34.6 to 36.8 nanometer at half height of the trench, and were 176.4 nanometer deep.

Example 4

A plating bath was prepared by combining DI water, 40 g/l copper as copper sulfate, 10 g/l sulfuric acid, 0.050 g/l chloride ion as HCl, 0.028 g/l of SPS and 3.00 ml/l of a 4.5 wt % solution in DI water of suppressor 1 as prepared in example 1.

A copper layer was electroplated onto a wafer substrate with feature sizes shown in FIG. 3 provided with a copper seed layer by contacting the wafer substrate with the above described plating bath at 25 degrees C. applying a direct current of −5 mA/cm$^2$ for 3 s or 6 s respectively. The thus electroplated copper layer was cross-sectioned and investigated by scanning electron micrograph (SEM) inspection.

Figure 4A:
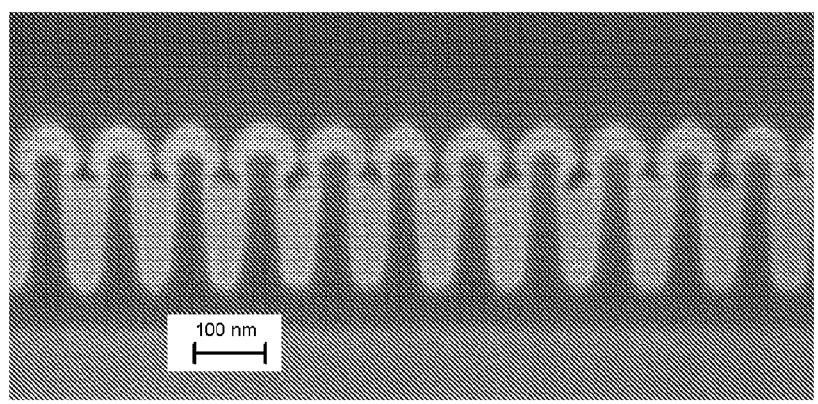
FIGS. 4a and 4b show SEM images of electroplated copper layers.
Figure 4B:
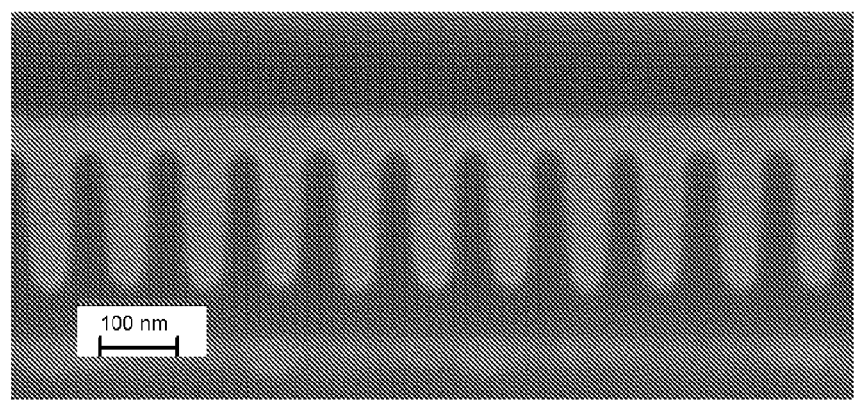

FIGS. 4a and 4b show the SEM images of the resulting electroplated copper layers. FIG. 4a exhibits partially filled trenches after 3 s plating without any voids or seams, and a flat copper growth front in the trenches can be clearly seen indicating the bottom-up filling which is idealized shown in FIG. 2a. The copper deposition on the sidewalls of the trenches was negligible small showing the strong suppression of the copper growth at the sidewalls of the trenches. All feature openings are still open. After 6 s plating all trenches are completely and defectfree filled exhibiting an overall homogeneous growth front as shown in FIG. 4b.

Example 5

A plating bath was prepared by combining DI water, 40 g/l copper as copper sulfate, 10 g/l sulfuric acid, 0.050 g/l chloride ion as HCl, 0.028 g/l of SPS, and 2.00 ml/l of a 5.4 wt % solution in DI water of suppressor 2 as prepared in example 2.

A copper layer was electroplated onto a wafer substrate with feature sizes shown in FIG. 3 provided with a copper seed layer by contacting the wafer substrate with the above described plating bath at 25 degrees C. applying a direct current of −5 mA/cm² for 3 s or 6 s respectively. The thus electroplated copper layer was cross-sectioned and investigated by SEM inspection.

Figure 5A:
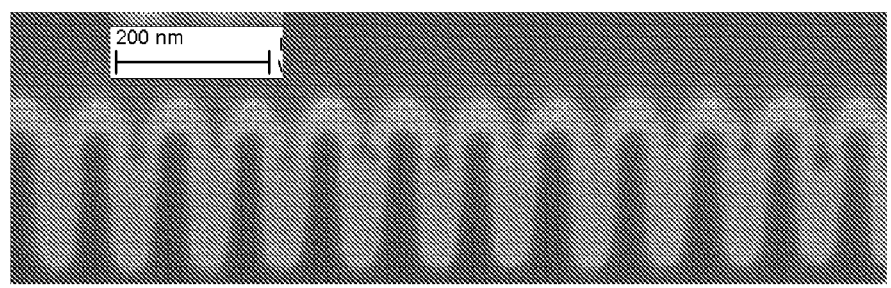
FIGS. 5 and 5b show SEM images of electroplated copper layers.
Figure 5B:
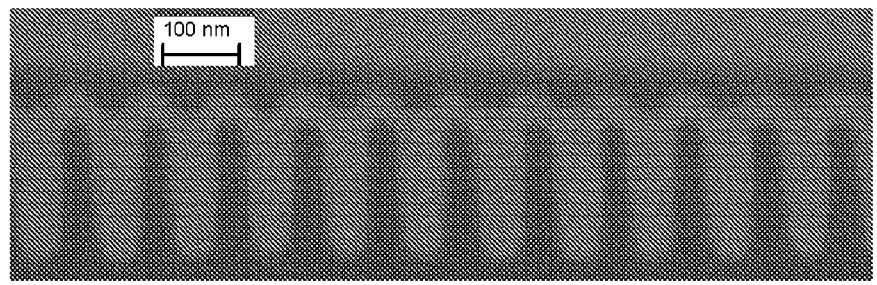

FIGS. 5a and 5b show the SEM images of the resulting electroplated copper layer. 3 s plating as shown in FIG. 5a provided partially filled trenches that exhibit a flat copper growth front with very little copper deposition on the sidewalls. The suppressing effect of the suppressor used in this example is slightly lower compared to the suppressor applied in example 4 while providing the same filling rate. Anyway, the copper deposition at the trench bottom exceeds the sidewall copper deposition yielding defectfree filled features after 6 s plating as shown in FIG. 5b.

Example 6

Comparative

A plating bath was prepared by combining DI water, 40 g/l copper as copper sulfate, 10 g/l sulfuric acid, 0.050 g/l chloride ion as HCl, 0.028 g/l of SPS, and 3.00 ml/l of a 4.5 wt % solution in DI water of suppressor 3 as prepared in example 3.

A copper layer was electroplated onto a wafer substrate with feature sizes shown in FIG. 3 provided with a copper seed layer by contacting the wafer substrate with the above described plating bath at 25 degrees C. applying a direct current of −5 mA/cm² for 3 s or 6 s respectively. The thus electroplated copper layer was cross-sectioned and investigated by SEM inspection.

FIGS. 6a and 6b show the SEM images of the resulting electroplated copper layers. The plating result after 3 s shown in FIG. 6a already clearly indicates that the suppressor candidate used in this example has not sufficient suppressing efficiency to provide voidfree bottom-up filling. Instead, after 3 s plating the trenches are partly filled but with significant copper deposition close to the trench opening thus causing closed trenches with large voids inside. The plating result after 6 s provided in FIG. 6b confirms the defectivity seen in FIG. 6a.

Example 7

Comparative

A mixture of sorbitol (30 g), water (30 g) and aqueous caesium hydroxide solution (concentration: 50 w % CsOH; 1.1 g) and additional water (20 g) were placed into a 2 l autoclave and water was removed at 100° C. in vacuo (<10 mbar) for 3 h. After nitrogen neutralization ethylene oxide (321.4 g) was added in portions at 130° C. during 16 h until 7 bar. Then, the mixture was cooled to 80° C. and stirred overnight. Subsequently, propylene oxide (750.1 g) was added in portions at 130° C. during 27 h until 7 bar. After additional 5 h the reaction mixture was cooled to 80° C., the reaction mixture was stripped with nitrogen and volatile compounds were removed in vacuo. After filtration, suppressor 4 was obtained as a light yellow liquid (1102 g) having a molecular weight distribution d=1.03.

Example 8

Comparative

A plating bath was prepared by combining DI water, 40 g/l copper as copper sulfate, 10 g/l sulfuric acid, 0.050 g/l chloride ion as HCl, 0.028 g/l of SPS, and 2.00 ml/l of a 5.4 wt % solution in DI water of suppressor 4 as prepared in example 7.

A copper layer was electroplated onto a wafer substrate with feature sizes shown in FIG. 3 provided with a copper seed layer by contacting the wafer substrate with the above described plating bath at 25 degrees C. applying a direct current of −5 mA/cm² for 3 s or 6 s respectively. The thus electroplated copper layer was cross-sectioned and investigated by SEM inspection under a tilt angle of 52°.

FIGS. 7a and 7b show the SEM images of the resulting electroplated copper layer. 3 s plating as shown in FIG. 7a provided partially filled trenches that exhibit an irregular rough copper growth front with inhomogeneously filled trenches. FIG. 7b reveals that after 6 sec plating some trenches are closed while exhibiting pinch-off voids due to insufficient suppressing effect of the applied suppressor at the trench openings.

The invention claimed is:

1. A composition, comprising a source of copper and an additive obtained by reacting
   in a first step
   a) a polyhydric alcohol comprising 5 to 6 hydroxyl functional groups
   with
   b) a first alkylene oxide comprising ethylene oxide and a second alkylene oxide selected from the group consisting of propylene oxide, butylene oxide and a mixture thereof from a mixture comprising the first alkylene oxide and the second alkylene oxide to produce a polyhydric alcohol comprising random copolymer side chains comprising said first alkylene oxide and said second alkylene oxide, and
   in a second step
   c) functionalizing terminal hydroxyl groups of said random copolymer side chains by reacting in at least one reaction selected from the group consisting of sulfatation and phosphatation.

2. The composition of claim 1, wherein the polyhydric alcohol is a compound of formula (I):

$$X(OH)_m \qquad (I),$$

wherein
m is an integer from 5 to 6,
X is an m-valent linear or branched aliphatic or cycloaliphatic radical comprising from 5 to 10 carbon atoms optionally substituted or unsubstituted.

3. The composition of claim 1, wherein the polyhydric alcohol is a linear or cyclic monosaccharide alcohol represented by formula (II) or (III):

$$HOCH_2-(CHOH)_n-CH_2OH \qquad (II);$$

$$(CHOH)_o \qquad (III),$$

wherein
n is an integer from 3 to 4, and
o is an integer from 5 to 6.

4. The composition of claim 3, wherein the monosaccharide alcohol is at least one selected from the group consisting of sorbitol, mannitol, xylitol, ribitol, inositol, and derivatives thereof.

5. The composition of claim 1, wherein the polyhydric alcohol is a monosaccharide of formula (IV) or (V):

$$CHO-(CHOH)_p-CH_2OH \qquad (IV);$$

$$CH_2OH-(CHOH)_q-CO-(CHOH)_r-CH_2OH \qquad (V),$$

and derivatives thereof, wherein p is an integer of 4, and q and r are integers, and q+r is 3 or 4.

6. The composition of claim 5, wherein the monosaccharide is at least one selected from the group consisting of allose, altrose, galactose, glucose, gulose, idose, mannose, talose, glucoheptose, mannoheptose, fructose, psicose, sorbose, tagatose, mannoheptulose, sedoheptulose, taloheptulose, alloheptulose, and derivatives thereof.

7. The composition of claim 1, wherein the additive is a random copolymer of said first alkylene oxide comprising ethylene oxide and said second alkylene oxide comprising propylene oxide.

8. The composition of claim 1, wherein a content of the first alkylene oxide in the additive is from 20 to 50% by weight.

9. The composition of claim 1, wherein a molecular weight, $M_w$, of the additive is 2,000-10000 g/mol.

10. The composition of claim 1, further comprising an accelerating agent.

11. The composition of claim 1, further comprising a leveling agent.

12. The composition of claim 1, wherein a content of the first alkylene oxide in the additive is from 25 to 40% by weight.

13. The composition of claim 1, wherein a molecular weight $M_w$ of the additive is 2,000 to 8000 g/mol.

14. The composition of claim 1, wherein said additive has a molecular weight $M_w$ of from 2,000 to 8,000 g/mol and an average degree of polyoxyalkylation of from about 10 to 500.

15. The composition of claim 1, wherein said additive has an average degree of polyoxyalkylation of from about 10 to 500.

16. The composition of claim 1, wherein said additive has a molecular weight $M_w$ of from 1,000 to 2,000 g/mol.

17. A metal plating bath, comprising the composition of claim 1, wherein the bath is suitable for depositing a metal on a substrate comprising features having an aperture size of 30 nanometers or less.

18. A process for depositing a metal layer on a substrate, the process comprising a) contacting a metal plating bath comprising the composition of claim 1 with a substrate, and b) applying a current density to the substrate to deposit a metal layer onto the substrate.

19. The process of claim 18, wherein the substrate comprises submicrometer-sized features, and the deposition fills the features.

20. The process of claim 19, wherein the submicrometer-sized features have an aperture size from 1 to 30 nm, an aspect ratio of 4 or more, or both.

* * * * *